United States Patent [19]
Angiulli et al.

[11] Patent Number: 5,365,204
[45] Date of Patent: Nov. 15, 1994

[54] CMOS VOLTAGE CONTROLLED RING OSCILLATOR

[75] Inventors: John M. Angiulli, Lagrangeville, N.Y.; Arun K. Ghose, Behala, India; Richard R. Konian; Samuel R. Levine, both of Poughkeepsie, N.Y.; David Meltzer, Wappingers Falls, N.Y.; Wen-Yuan Wang; Leon L. Wu, both of Hopewell Junction, N.Y.

[73] Assignee: International Business Machines Corporation, Armonk, N.Y.

[21] Appl. No.: 145,364

[22] Filed: Oct. 29, 1993

[51] Int. Cl.$^5$ ............... H03B 5/24; H03K 3/354
[52] U.S. Cl. .................... 331/57; 331/135; 331/177 R; 331/179
[58] Field of Search .......... 331/57, 135, 177 R, 331/179

[56] References Cited

U.S. PATENT DOCUMENTS

| | | | |
|---|---|---|---|
| 4,105,950 | 8/1978 | Dingwall | 331/57 |
| 4,388,537 | 6/1983 | Kanuma | 307/297 |
| 4,458,165 | 7/1984 | Jackson | 307/595 |
| 4,517,532 | 5/1985 | Neidorff | 331/57 |
| 4,547,749 | 10/1985 | Kuo | 331/57 |
| 4,587,480 | 5/1986 | Zasio | 324/73 R |
| 4,617,529 | 10/1986 | Suzuki | 331/57 |
| 4,859,970 | 8/1989 | Matsuo et al. | 331/57 |
| 4,884,041 | 11/1989 | Walker | 331/57 |

FOREIGN PATENT DOCUMENTS

3-192812  8/1991  Japan .

OTHER PUBLICATIONS

B. A. Chappell, T. I. Chappell, S. E. Schuster, "Voltage-Controlled Oscillator", IBM Technical Disclosure Bulletin, vol. 33, No. 10A, Mar. 1991, pp. 286–288.

*Primary Examiner*—Siegfried H. Grimm
*Attorney, Agent, or Firm*—Lynn L. Augspurger

[57] ABSTRACT

A variable frequency digital ring oscillator which can be formed in a small area for use in testing of chips employs a ring oscillator formed of CMOS inverters, transmission gates and capacitors and CMOS logic as a voltage controlled ring oscillator. A wide range of frequency of oscillation is achieved with small number of components. The ring oscillator circuit's oscillator frequency is controlled only by DC voltages, such as may be provided by (but not limited to) a manufacturing chip tester. The output signal of the oscillator swings between Vdd and Vss and does not need additional level translation circuits to drive CMOS logic. The ring oscillator can be composed of an odd number of CMOS inverters connected in cascade to form a loop. We provide a CMOS transmission gate with PMOS and NMOS transistor device inserted between each adjacent inverter and a MOS capacitor connected between the output of each transmission gate and the Vss supply of the ring oscillator circuit (conventionally ground). The gate voltages of the PMOS and NMOS transistors in the transmission gate are different and provide a different DC voltage between Vdd and Vss. Variation of the gate voltages of the transmission gates controls the frequency of oscillation of the circuit. The use of a plurality of cascaded delay elements between inverters achieves a wider range of oscillation frequency than possible with a single delay element.

9 Claims, 2 Drawing Sheets

CMOS VOLTAGE CONTROLLED RING OSCILLATOR

FIELD OF THE INVENTION

This invention is related to a voltage controlled programmable digital oscillator and particularly to a voltage controlled programmable digital oscillator fabricated on a CMOS integrated circuit chip, suitable for use as part of a larger system on such a chip such as on-chip clock generation, phase locked loop, or on chip test clock generation.

BACKGROUND OF THE INVENTION

As background for our invention, U.S. Pat. No. 4,617,529, issued Oct. 14, 1986, to A. Suzuki shows a ring oscillator composed of CMOS inverters coupled in cascade with a RC delay element inserted between adjacent inverters. However, this prior art uses a fixed delay element and has no other means of variability, making it unusable as a voltage controlled oscillator.

In addition, we would note that there are patents of which we are aware which are listed below with a brief discussion of each of the patents.

U.S. Pat. No. 4,859,970, issued Aug. 22, 1989 to Matsuo et al. and assigned to Kabushiki Kaisha Toshiba, shows a Voltage Controlled Oscillator, one element of which is a voltage controlled delay element comprising CMOS transmission gates connected between adjacent CMOS inverters. The gate of each of the PMOS and NMOS transistors of each transmission gate is connected to a variable control voltage which is used to vary the delay. This circuit does not have a MOS capacitor on the output of the transmission gate structure but uses the parasitic capacitance of the devices and the inverter gates to form the capacitance of the RC delay element needed. This circuit is not an oscillator but requires a phase comparator and other elements of a phase locked loop to generate a stable oscillation.

U.S. Pat. No. 4,517,532, issued May 14, 1985 to R. A. Neidorff and assigned to Motorola, Inc shows a ring oscillator composed of a plurality of inverting gates connected in a loop configuration which has a bypass mechanism which is used to alter the frequency of oscillation. This circuit may be varied in discrete steps only and has no voltage control nor continuous variability. Its preferred embodiment is bipolar 12L and not CMOS.

U.S. Pat. No. 4,884,041, issued Nov. 28, 1989 to R. C. Walker and assigned to the Hewlett-Packard Company, shows a ring oscillator which may be integrated on chip comprising an N element ring oscillator merged with an M element ring oscillator by using a linear combining circuit. Variation of the control voltage allows variation of the oscillator frequency by varying the proportion of combination of the M and N stage oscillator outputs, not by varying the frequency of the individual oscillators using a voltage controlled delay. The control voltage in the patent must take on only a small number of discrete values due to the inherent nature of the combining circuit.

U.S. Pat. No. 4,105,950, issued Aug. 8, 1978 to A. G. F. Dingwall and assigned to the RCA Corporation, shows a VCO comprised of nested oscillating loops one element of which is a CMOS inverter wherein a control voltage is coupled to cause the frequency of oscillation to change in response to changes in the control voltage. However, the control voltage causes a variation in the source voltage of the PMOS transistor of the inverter and a variation in the drain voltage of the NMOS transistor of the inverter, and is not a transmission gate. This causes the voltage swing of the output to be less than the full Vdd to Vss possible with a normal inverter and severely limits the frequency variation possible by varying the control voltage.

U.S. Pat. No. 4,458,165, issued Jul. 3, 1984 to R. M. Jackson and assigned to Tektronix, Inc. shows a delay element composed of cascaded inverters which can be programmed to different delays by bypassing inverter stages using standard digital multiplexor logic. There is no continuous variability and all preferred embodiments require edge triggered flip-flops which are difficult to build and consume large circuit area in the CMOS technology.

U.S. Pat. No. 4,388,537, issued Jun. 14, 1983 to A. Kanuma and assigned to Tokyo Shibaura Denki Kabushiki Kaisha discloses a substrate bias generator which includes a voltage controlled oscillator whose oscillation frequency is controlled in accordance with a feedback voltage derived from the substrate bias voltage. This circuit is composed of NMOS inverters connected in a loop. Each inverter is connected to the following inverter in cascade through an NMOS transmission gate with a MOS capacitor inserted at the output of the transmission gate. It does not use CMOS inverter or transmission gate circuits and thus consumes DC power. The voltage control of the oscillator frequency is an AC voltage derived from the oscillator output and is not a DC control voltage.

Japanese Patent Literature (J03192812) shows a ring oscillator composed of NMOS inverters in cascade connected in a loop with each inverter connected to the following inverter in cascade through an NMOS transmission gate. The gate of the NMOS transmission gate is connected to a DC control voltage which varies the DC resistance of the transmission gate to vary the frequency of oscillation. This circuit does not use CMOS nor a fixed capacitor thus increasing the power consumed and limiting the range of variation of frequency.

U.S. Pat. No. 4,547,749, issued Oct. 15, 1985 to C. C. K. Kuo and assigned to Motorola, Inc. shows a voltage and temperature compensated FET ring oscillator composed of 3 NMOS inverters connected in a loop with the output of each inverter connected to the input of the next inverter in cascade through an NMOS transmission gate. The output of the transmission gate is connected to an NMOS capacitor whose other side is connected to the reference voltage terminal. The gate terminals of the transmission gate devices are driven by a voltage derived from the supply voltage which varies with temperature. It therefore is a DC control voltage which varies the frequency of oscillation to compensate for circuit temperature variations. The circuit is connected between a voltage compensated node and ground and as such does not have a full voltage swing between Vdd and ground. This prevents its use for driving logic without special voltage translation circuits. It also consumes DC power since it does not use CMOS gates.

Prior Art: Publications

B. A. Chappell, T. I. Chappell, S. E. Schuster, "Voltage Controlled Oscillator" in IBM Technical Disclosure Bulletin Volume 33, No. 10A, March, 1991 pp. 286–288 shows a ring oscillator composed of 3 CMOS inverters connected in cascade with a CMOS transmission gate inserted between each inverter. The gate of each of the PMOS and NMOS transistors of each transmission gate is connected to a variable control voltage which is used to vary the resistance of the gate. However, this circuit (as in U.S. Pat. No. 4,859,970) does not have a MOS capacitor on the output of the transmission gate structure but uses the parasitic capacitance of the devices and the inverter gates to form the capacitance of the RC delay element needed. This severely limits the range of variability of the oscillation and increases the difficulty of achieving low frequency oscillations.

SUMMARY OF THE INVENTION

Our invention deals with the use of CMOS inverters, transmission gates and capacitors and CMOS logic as a voltage controlled ring oscillator.

The improvements which we have made achieve a wide range of frequency of oscillation with a small number of components such that it may be placed on a small area of an integrated circuit chip. In accordance with our invention the ring oscillator circuit's oscillator frequency is controlled only by DC voltages, such as may be provided by (but not limited to) a manufacturing chip tester. The output signal of the oscillator swings between Vdd and Vss and does not need additional level translation circuits to drive CMOS logic.

In accordance with our invention we have provided a ring oscillator composed of an odd number of CMOS inverters connected in cascade to form a loop. We provide a plurality of CMOS transmission gates with PMOS and NMOS transistor devices inserted between each adjacent inverter and a MOS capacitor connected between the output of each transmission gate and the Vss power supply of the ring oscillator circuit (conventionally ground). The gate voltages of the PMOS and NMOS transistors in the transmission gate are different and provide a different DC voltage between Vss and Vdd.

In accordance with our invention, variation of the gate voltages of the transmission gates controls the frequency of oscillation of the circuit.

The use of a plurality of cascaded delay elements between inverters achieves a wider range of oscillation frequency than possible with a single delay element.

These and other improvements are set forth in the following detailed description. For a better understanding of the invention with advantages and features, refer to the description and to the drawings.

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to illustrate, by way of example, an intended use of a voltage controlled oscillator on an integrated circuit chip. During testing of said integrated circuit chips a source of clocking signals is required. These high frequency signals are difficult to supply to the chip from an external tester. Also, during testing the frequency of said clocking signals should be variable.

Our preferred solution to this problem is our circuit which is an oscillator with a frequency range wide enough to satisfy the test requirements and which can be fabricated on a very small area of the chip. Furthermore, the signals necessary to control the frequency of the clock should be of very low frequency themselves, preferably D.C.

All the examples of prior related art discussed above either are not capable of being built on a CMOS integrated circuit, have too large an area, insufficient frequency range and/or require AC control voltages.

The Preferred Embodiment

Figure 1:
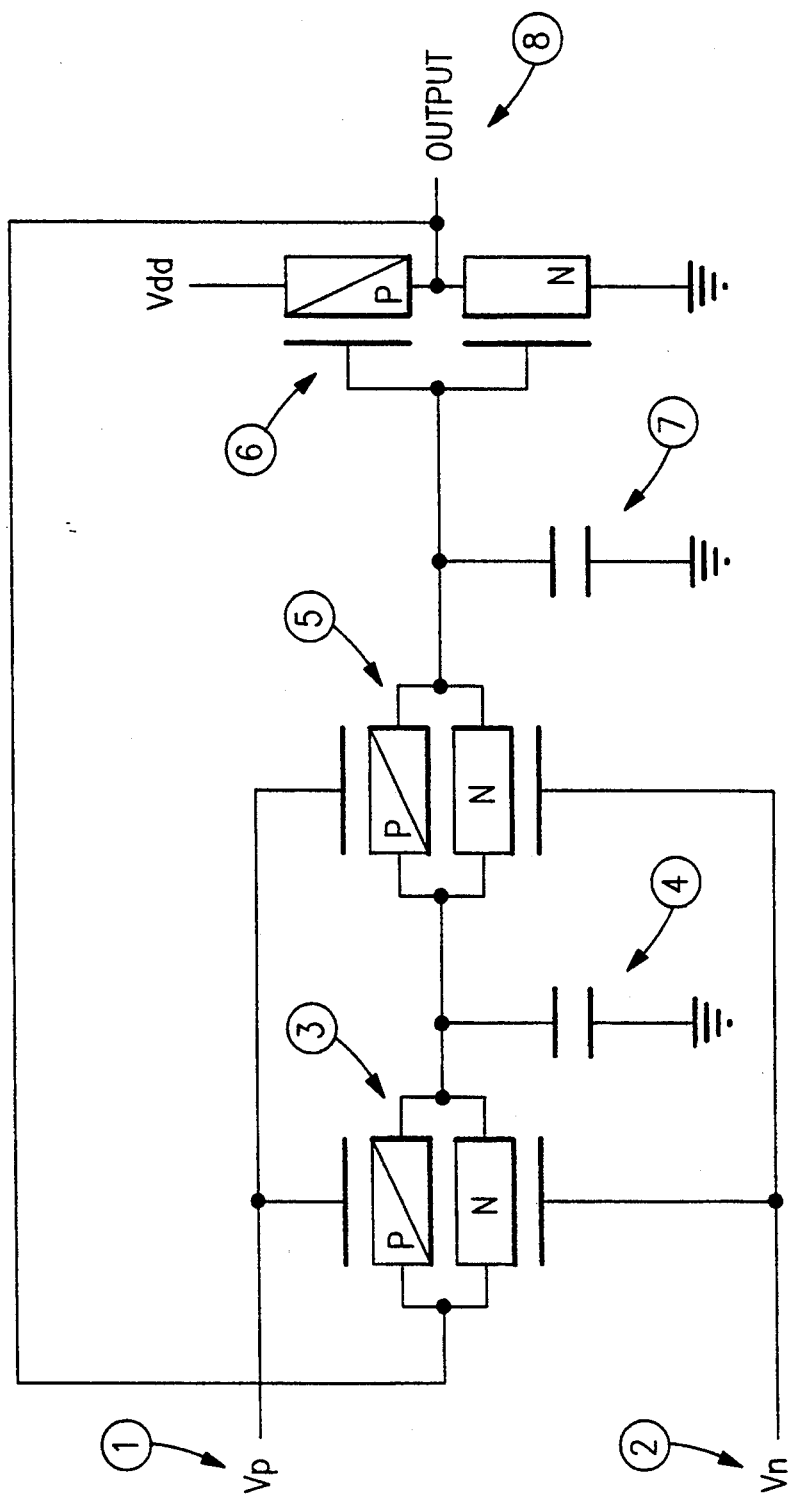
FIG. 1 shows our basic ring oscillator circuit as a single basic ring oscillator using the invention, and a plurality of these basic oscillator circuits may be cascaded to form the complete circuit of FIG. 2.

Turning now to our invention in greater detail, FIG. 1 illustrates our preferred embodiment of the basic invention.

A CMOS inverter 6 drives a cascaded delay element having a CMOS transmission gate 3 driving a CMOS capacitor 4 and a second CMOS transmission gate 5. The second or additional transmission gate 5 drives a CMOS capacitor 7 and the input gates of CMOS inverter 6. This connection forms a loop containing a signal inversion which, as will be understood now by those skilled in the art, forms a circuit which will oscillate. This oscillation will be a full voltage range CMOS signal which may be fed from the output 8 of the ring oscillator circuit to other CMOS logic circuits. The frequency of oscillation will be a function of the resistance of the path through the transmission gates 3, 5 and the capacitance of the diffused CMOS capacitors 4, 7 and the gain of the transistors in the inverter 6. The control voltages Vp 1 and Vn 2 put bias on the gates of transmission gates 3, 5 thus varying the DC resistance path through the transmission gates. These voltages represent a bias value so they may be provided to the circuit as DC control voltages.

Alternative Preferred Embodiments

Figure 2:
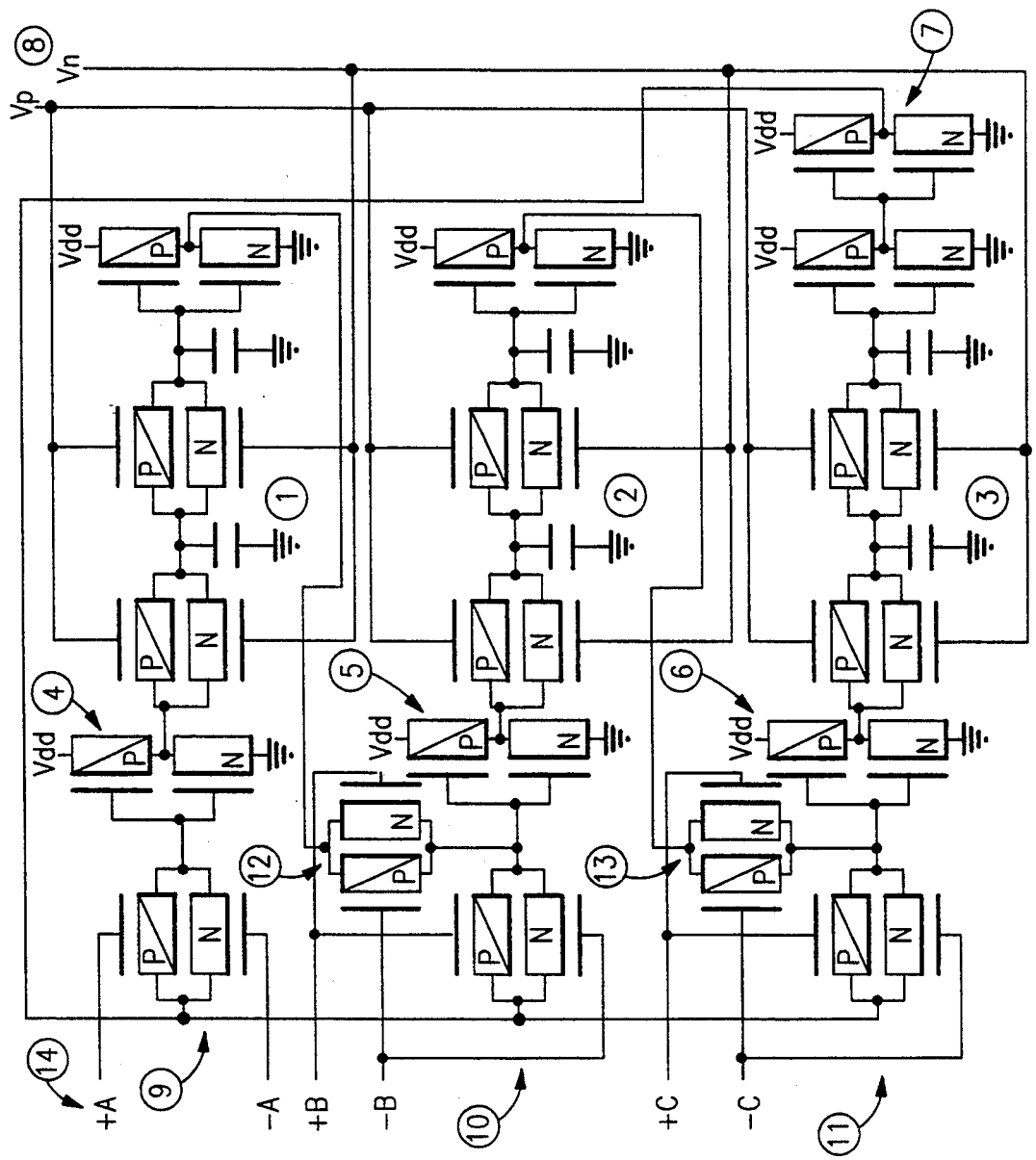
FIG. 2 shows a full circuit in accordance with our invention schematically as the preferred alternative implementation of our invention, particularly showing an expanded voltage controlled ring oscillator of three cascaded sections, each composed of CMOS inverters, transmission gates and capacitors. Two of the sections may be bypassed by logic signals to extend the range of oscillation beyond that achieved by variation of the control voltages Vn and Vp.

FIG. 2 shows how the basic elements of FIG. 1 may be used in accordance with our further invention. The basic elements are combined with CMOS transmission gate logic to extend the range of the basic circuit. The same elements shown in FIG. 1 and described above are replicated as a basic inverting delay circuit 1, 2, 3. The output of each basic circuit is not connected to form a loop. The output of circuit 1 goes to transmission gate 12. The input of circuit 1 is from the output of inverter 4 fed by the output of transmission gate 9. Similarly, circuit 2 is fed by inverter 5 which is fed from the node comprising the outputs of transmission gates 10 and 12. The output of circuit 2 is connected to the input of transmission gate 13. Circuit 3 is fed by inverter 6 driven from the node comprising the outputs of transmissions gates 13, 11. The output of circuit 3 is connected to the input of inverter 7. The output of inverter 7 is connected to the inputs of transmission gates 9, 10, 11 thus forming a programmable loop connection depending on the state of logical control signals +A, −A, +B, −B, +C and −C 14. These control signals can assume values of Vdd or ground. Let the state where +A is Vdd and −A is ground be referred to as A=1 and the state where +A is ground and −A is Vdd be referred to as A=0. Similarly, for B and C. It can be seen that when A=0, B=1, C=1 that the three circuits 1, 2, 3 are connected in cascade and form an inverting loop with inverter 7. Similarly when A=1, B=0 and C=1 circuits 2 and 3 are connected in cascade, circuit 1 is unconnected, and the two circuits are connected in a loop with inverter 7 through transmission gate 10 When A=1, B=1, and C=0 circuit 3 is connected in a loop with the output of inverter 7 connected to the input of inverter 6 through transmission gate 11.

If the range of oscillation of the basic circuit of FIG. 1 over the full range of Vp and Vn is from Flow to Fhigh, then the circuit of FIG. 2 has a range of approximately Flow/3 to Fhigh.

Alternatively, the logic of transmission gates 9, 10, 12, 11, 13 may be replaced with alternative CMOS logic implementations as determined by the total frequency range required and the polarity and number of the logic control signals used.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A variable frequency digital oscillator comprising:
a digital ring oscillator circuit having two supply voltages Vss and Vdd; and
an odd number of CMOS inverters connected in cascade to form a loop; and
a plurality of CMOS transmission gates coupled between each adjacent pair of said CMOS inverters; and
a MOS capacitor connected between the output of each transmission gate and said Vss supply.

2. An oscillator according to claim 1 wherein the CMOS transmission gates are formed of PMOS and NMOS transistors and having DC gate voltages of the CMOS transmission gates PMOS and NMOS transistors which are different and each different DC voltage is between Vss and Vdd.

3. An oscillator according to claim 2 wherein each transmission gate and a MOS capacitor form an RC delay element having a delay proportional to the gate voltages on the transmission gate PMOS and NMOS transistor gates, and wherein a variation of said DC gate voltages changes the frequency of oscillation of the ring oscillator circuit.

4. An oscillator according to claim 3 wherein is provided an odd number of inverters coupled in cascade with a CMOS RC delay element having a delay proportional to the gate voltages on the transmission gate PMOS and NMOS transistor gates coupled between two adjacent ones of said odd number of inverters, and having transmission gates connected to bypass an even number of inverters of said ring oscillator circuit; and wherein the output of the last unbypassed inverter is connected to the input of the first of said odd number of CMOS inverters to form a ring loop.

5. An oscillator according to claim 4 wherein in operation said bypass transmission gates change the frequency of oscillation of the circuit.

6. An oscillator according to claim 3 wherein is provided an even multiple number of inverters coupled in cascade with a CMOS RC delay element having a delay proportional to the gate voltages on the transmission gate PMOS and NMOS transistor gates coupled between two adjacent ones of said even number of multiple inverters, and having a plurality of said ring oscillator circuits connected in cascade; and wherein transmission gate PMOS and NMOS transistor gates are connected to bypass individual circuits, and the output of the last unbypassed inverter is connected to the input of an inverter, not one of said even multiple number of inverters, whose output is connected to the first of the plurality of circuits to form a loop.

7. An oscillator according to claim 6 wherein operation of said bypass transmission gates changes the frequency of oscillation of the circuit.

8. An oscillator according to claim 7 wherein is also provided an odd multiple number of inverters coupled in cascade with a CMOS RC delay element having a delay proportional to the gate voltages on the transmission gate PMOS and NMOS transistor gates coupled between two adjacent ones of said odd number of multiple inverters, and having transmission gates connected to bypass an even number of inverters of said ring oscillator circuits; and wherein the output of the last unbypassed inverter is connected to the input of the first of said odd number of CMOS inverters to form a ring loop, and the combined plurality of inverters widens the range of possible oscillation frequencies of the oscillator circuit.

9. An oscillator according to claim 1 wherein said Vss power supply is ground.

* * * * *